(12) United States Patent
Qi et al.

(10) Patent No.: US 9,496,293 B2
(45) Date of Patent: Nov. 15, 2016

(54) PIXEL CIRCUIT AND METHOD FOR DRIVING THE SAME, DISPLAY PANEL AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Xiaojing Qi, Beijing (CN); Wen Tan, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 220 days.

(21) Appl. No.: 14/366,184

(22) PCT Filed: Nov. 1, 2013

(86) PCT No.: PCT/CN2013/086461
§ 371 (c)(1),
(2) Date: Jun. 17, 2014

(87) PCT Pub. No.: WO2015/000245
PCT Pub. Date: Jan. 8, 2015

(65) Prior Publication Data
US 2015/0028762 A1    Jan. 29, 2015

(30) Foreign Application Priority Data
Jul. 2, 2013  (CN) .......................... 2013 1 0275959

(51) Int. Cl.
*G06F 3/038*       (2013.01)
*G09G 5/00*        (2006.01)
(Continued)

(52) U.S. Cl.
CPC ......... *H01L 27/1255* (2013.01); *G09G 3/3233* (2013.01); *G09G 2300/0804* (2013.01);
(Continued)

(58) Field of Classification Search
CPC ................... G09G 3/3233; G09G 2300/0842; G09G 2300/0861; G09G 2320/0233; G09G 2300/0804; G09G 2320/043; H01L 27/1255
See application file for complete search history.

(56) References Cited

U.S. PATENT DOCUMENTS

2007/0035483 A1   2/2007  Chang
2009/0096725 A1*  4/2009  Kretz ................... G09G 3/3233
                                                       345/82

FOREIGN PATENT DOCUMENTS

CN   102956199 A   3/2013
CN   103000131 A   3/2013
(Continued)

OTHER PUBLICATIONS

International Search Report (Chinese language) issued by the State Intellectual Property Office ("SIPO") on Mar. 27, 2014 for International Application No. PCT/CN2013/086461, 17 pages.
(Continued)

*Primary Examiner* — Charles Hicks
(74) *Attorney, Agent, or Firm* — Banner & Witcoff, Ltd.

(57) ABSTRACT

A pixel circuit and a method for driving the same, a display panel and a display apparatus are configured to improve the lifespan of the pixel circuit. The pixel circuit comprises: a charging sub-circuit (1), a capacitor ($C_{ST}$), a first driving sub-circuit (2) and a second driving sub-circuit (3); a first terminal of the capacitor ($C_{ST}$) is connected to a first terminal of the first driving sub-circuit (2) and a first terminal of the second driving sub-circuit (3), and a second terminal of the capacitor ($C_{ST}$) is connected to the charging sub-circuit (1); a second terminal of the first driving sub-circuit (2) is connected to a first light emitting device (D1), a second terminal of the second driving sub-circuit (3) is connected to a second light emitting device (D2), wherein a driving current ($I_1$) flowing from the first driving sub-circuit (2) to the first light emitting device (D1) is in an opposite direction to a driving current ($I_2$) flowing from the second driving sub-circuit (3) to the second light emitting device (D2); the charging sub-circuit (1) is configured to charge the capacitor ($C_{ST}$), and when the capacitor ($C_{ST}$) is discharged, the first driving sub-circuit (2) drives the first light emitting device (D1) to emit light or the second driving sub-circuit (3) drives the second light emitting device (D2) to emit light.

20 Claims, 11 Drawing Sheets

(51) Int. Cl.
  *H05B 37/02* (2006.01)
  *H05B 39/04* (2006.01)
  *H05B 41/36* (2006.01)
  *H01L 29/12* (2006.01)
  *H01L 29/786* (2006.01)
  *H01L 27/12* (2006.01)
  *G09G 3/32* (2016.01)

(52) U.S. Cl.
  CPC ............ *G09G2300/0842* (2013.01); *G09G 2300/0861* (2013.01); *G09G 2320/0233* (2013.01); *G09G 2320/043* (2013.01)

(56) References Cited

FOREIGN PATENT DOCUMENTS

| | | |
|---|---|---|
| CN | 202855266 U | 4/2013 |
| CN | 202976779 U | 6/2013 |
| CN | 203480803 U | 3/2014 |

OTHER PUBLICATIONS

English abstract of CN103000131A, listed above, 1 page.
English abstract of CN102956199A, listed above, 1 page.
English abstract of CN202976779U, listed above, 1 page.
English abstract of CN202855266U, listed above, 1 page.
English abstract of CN203480803U, listed above, 1 page.
First Office Action (Chinese language) issued by the State Intellectual Property Office ("SIPO") on Dec. 3, 2014 for International Application No. 201310275959.1, 6 pages.
English translation of first Office Action (listed above) issued by SIPO for International Application No. 201310275959.1, 3 pages.
Jan. 5, 2016—International Preliminary Report on Patentability Appn PCT/CN2013/086461.
Jan. 5, 2016 (WO)—International Preliminary Report on Patentability Appn PCT/CN2013/086461.

* cited by examiner

PIXEL CIRCUIT AND METHOD FOR DRIVING THE SAME, DISPLAY PANEL AND DISPLAY APPARATUS

CROSS REFERENCE TO RELATED APPLICATIONS

This application is based on International Application No. PCT/CN2013/086461 filed on Nov. 1, 2013, which claims priority to Chinese National Application No. 201310275959.1 filed on Jul. 2, 2013. The entire contents of each and every foregoing application are incorporated herein by reference.

TECHNICAL FIELD OF THE DISCLOSURE

The present disclosure relates to the technical field of organic light-emitting display, and particularly to a pixel circuit and a method for driving the same, a display panel and a display apparatus.

BACKGROUND

The organic light-emitting display device has drawn lots of attention due to its advantages such as low power consumption, high brightness, low cost, wide angle of view, fast response and so on, and has been widely used in the technical field of organic light-emitting.

The Organic Light Emitting Diode (OLED) is a light emitting device that is used commonly in the organic light-emitting field. Currently, OLED can be classified into a passive driving type and an active driving type, that is, a direct addressing type and a Thin Film Transistor (TFT) matrix addressing type, according to its driving manner. The active driving OLED is also referred to as an Active Matrix OLED (AMOLED), wherein the light-emitting devices in each pixel unit are driven to emit light by a pixel circuit and a power line for loading a direct current (DC) power source voltage signal ($V_{dd}$ or $V_{ss}$).

Referring to FIG. 1, it is a structural schematic diagram of a pixel circuit for driving a light emitting device to emit light in the prior art. Taking N type driving transistor as an example, the pixel circuit comprises a driving transistor T1, a capacitor C1, and a switching transistor T2. A first terminal of the capacitor C1 is connected to the gate of the driving transistor T1, and a second terminal of the capacitor C1 is connected with a low level reference voltage source Vss. The drain of the switching transistor T2 is connected to the gate of the driving transistor T1, the gate of the switching transistor T2 is connected with a gate signal source $V_{Scan}$, and the source of the switching transistor T2 is connected with a data signal source $V_{Data}$. The source of the driving transistor T1 is connected with a high level reference voltage source $V_{DD}$, the drain of the driving transistor T1 is connected to the anode of the light emitting device D1, and the cathode of the light emitting device D1 is connected with a low level reference voltage source Vss.

During a period in which one frame of picture is displayed, before the light emitting device D1 is driven to emit light, the gate signal source $V_{Scan}$ outputs a voltage signal to turn on the switching transistor T2, the data signal source $V_{data}$ is connected to a branch where the capacitor C1 is located, and the data signal source $V_{Data}$ outputs a data signal to be applied to the first terminal of the capacitor C1 to charge the capacitor C1; when the light emitting device D1 is driven to emit light, the gate signal source $V_{Scan}$ outputs a voltage signal to turn off the switching transistor T2, and the data signal source $V_{Data}$ is disconnected with the branch where the capacitor C1 is located, such that the capacitor C1 is discharged to drive the light emitting device D1 to emit light.

The pixel circuit provided in the prior art comprises only one driving transistor and a light emitting device connected to the driving transistor. During a period in which one frame of picture is displayed, the driving transistor in the pixel circuit drives the light emitting device to emit light. The AMOLED display drives the OLED to emit light by DC driving. The electric field corresponding to a long-term DC driving voltage would polarize ions inside the OLED, such that a built-in electric field is formed in the OLED, thus increasing the threshold voltage of the OLED, decreasing the light-emitting efficiency of the OLED a lot, and shortening the lifespan of the OLED. The lifespan is an important factor limiting the wide application of the organic light-emitting display, especially of the organic light-emitting display with a large size and high intensity.

SUMMARY

In the embodiments of the present disclosure, there are provided a pixel circuit and a method for driving the same, a display panel and a display apparatus for improving the lifespan of the light emitting device in the display apparatus.

The pixel circuit provided in the embodiments of the present disclosure comprises: a charging sub-circuit, a capacitor, a first driving sub-circuit and a second driving sub-circuit.

A first terminal of the capacitor is connected to a first terminal of the first driving sub-circuit and a first terminal of the second driving sub-circuit, and a second terminal of the capacitor is connected to the charging sub-circuit.

A second terminal of the first driving sub-circuit is connected to a first light emitting device, a second terminal of the second driving sub-circuit is connected to a second light emitting device, and a driving current flowing from the first driving sub-circuit to the first light emitting device is in an opposite direction to a driving current flowing from the second driving sub-circuit to the second light emitting device.

The charging sub-circuit is configured to charge the capacitor, and when the capacitor is discharged, the first driving sub-circuit drives the first light emitting device to emit light or the second driving sub-circuit drives the second light emitting device to emit light.

Optionally, the first driving sub-circuit comprises a n-type driving transistor, and the second driving sub-circuit comprises a p-type driving transistor.

The gate of the n-type driving transistor is connected to the first terminal of the capacitor, the source of the n-type driving transistor is connected to a first reference voltage source capable of supplying an alternate current (AC) signal, the drain of the n-type driving transistor is connected to the cathode of the first light emitting device, and the anode of the first light emitting device is connected to a second reference voltage source.

The gate of the p-type driving transistor is connected to the first terminal of the capacitor, the source of the p-type driving transistor is connected to the first reference voltage source, the drain of the p-type driving transistor is connected to the anode of the second light emitting device, and the cathode of the second light emitting device is connected to the second reference voltage source.

The second terminal of the capacitor is connected to the charging sub-circuit and the first reference voltage source.

Optionally, the charging sub-circuit comprises a first gate signal source, a data signal source and a first switching transistor.

The drain of the first switching transistor is connected to the data signal source, the source of the first switching transistor is connected to the second terminal of the capacitor, and the gate of the first switching transistor is connected to the first gate signal source.

The first gate signal source is configured to control the first switching transistor to be turned on to connect the data signal source with the branch where the capacitor is located, such that the capacitor is charged by the data signal source.

Optionally, the pixel circuit further comprises a first compensation sub-circuit connected to the first driving sub-circuit, and a second compensation sub-circuit connected to the second driving sub-circuit.

The first compensation sub-circuit comprises a second switching transistor, the second compensation sub-circuit comprises a third switching transistor.

The source of the second switching transistor is connected to the gate of the n-type driving transistor, the drain of the second switching transistor is connected to the drain of the n-type driving transistor, and the gate of the second switching transistor is connected to a second gate signal source.

The source of the third switching transistor is connected to the gate of the p-type driving transistor, the drain of the third switching transistor is connected to the drain of the p-type driving transistor, and the gate of the third switching transistor is connected to the second gate signal source.

Optionally, the pixel circuit further comprises a fourth switching transistor configured to control a connection from the first light emitting device and the second light emitting device to the second reference voltage source, wherein the gate of the fourth switching transistor is connected to a charging control signal source, the source of the fourth switching transistor is connected to the anode of the first light emitting device and the cathode of the second light emitting device, the drain of the fourth switching transistor is connected to the second reference voltage source, and the charging control signal source is configured to control the fourth switching transistor to be turned on or off.

Optionally, the pixel circuit further comprises a fifth switching transistor configured to control a connection between the capacitor and the first reference voltage source.

The gate of the fifth switching transistor is connected to a third gate signal source, the source of the fifth switching transistor is connected to the first reference voltage source, and the drain of the fifth switching transistor is connected to the second terminal of the capacitor.

The third gate signal source is configured to control the fifth switching transistor to be turned on or off.

Optionally, the first switching transistor, the second switching transistor and the third switching transistor are n-type transistors, and the fifth switching transistor is a p-type transistor; or the first switching transistor, the second switching transistor and the third switching transistor are p-type transistors, and the fifth switching transistor is a n-type transistor.

The first gate signal source, the second gate signal source and the third gate signal source are a same gate signal source.

The display panel provided in the embodiments of the present disclosure comprises a plurality of pixel units arranged in matrix surrounded by gate lines and data lines, each of the pixel unit comprises one pixel circuit and a first light emitting device and a second light emitting device connected to the pixel circuit, wherein the pixel circuit is the pixel circuit described in the above.

The charging sub-circuits in the pixel circuits located in a same row are connected to one and the same gate line, and the charging sub-circuits in the pixel circuits located in a same column are connected to one and the same data line. During a period in which one frame of picture is displayed, before the first driving sub-circuits and the second driving sub-circuits drive the first light emitting devices to emit light and the second light emitting devices to emit light respectively in sequence, the charging sub-circuits charge the capacitors through the data line and the gate line.

Optionally, the drain of the first switching transistor is connected to the data signal source through the data line, the gate of the first switching transistor is connected to the first gate signal source through the gate line; and the gate signal source and the data signal source charge the capacitor through the gate line and the data line respectively.

The display apparatus provided in the embodiments of the present disclosure comprise said display panel.

The method for driving the pixel circuit described above provided in the embodiments of the present disclosure comprises: during a period in which one frame of picture is displayed, the first driving sub-circuit and the second driving sub-circuit driving the first light emitting device to emit light and the second light emitting device to emit light respectively in sequence under the control of timing sequence; and before the first driving sub-circuit drives the first light emitting device to emit light, the charging sub-circuit charging the capacitor, and when the capacitor is discharged, the first driving sub-circuit driving the first light emitting device to emit light or the second driving sub-circuit driving the second light emitting device to emit light.

Optionally, when the first reference voltage source is controlled to output a high level and the second reference voltage source is controlled to output a low level, the branch where the first driving sub-circuit is located is disconnected, the branch where the second driving sub-circuit is located is connected, and the second driving sub-circuit drives the second light emitting device to emit light; and when the first reference voltage source is controlled to output the low level and the second reference voltage source is controlled to output the high level, the branch where the second driving sub-circuit is located is disconnected, the branch where the first driving sub-circuit is located is connected, and the first driving sub-circuit drives the first light emitting device to emit light.

According to the present disclosure, a first light emitting device and a second light emitting device connected in parallel are arranged in each pixel area, the operating current of the first light emitting device is in an opposite direction to that of the second light emitting device, and the first light emitting device and the second light emitting device are driven to emit light by the first driving sub-circuit and the second driving sub-circuit respectively. The first light emitting device and the second light emitting device emit light alternately, such that the lifespan of each light emitting device can be prolonged.

DETAILED DESCRIPTION

It is noted that there is no substantial difference between the source and the drain for a transistor in the liquid crystal display field. Therefore, the source of a transistor mentioned in embodiments of the present disclosure can be the drain of the transistor, and the drain of the transistor mentioned in embodiments of the present disclosure can be the source of the transistor.

In embodiments of the present disclosure, there are provided a pixel circuit and a method for driving the same, a display panel and a display apparatus for improving the lifespan of the light emitting devices in the display apparatus and improving the light-emitting display uniformity of the light emitting device.

An AMOLED display panel comprises a plurality of pixel units arranged in matrix surrounded by gate lines and data lines, and each pixel unit comprises one pixel circuit. In the present disclosure, a first driving sub-circuit and a second driving sub-circuit connected in parallel are arranged in each pixel circuit, and are configured to drive a first light emitting device and a second light emitting device respectively connected thereto to emit light alternately during different periods, respectively. For example, during a period t in which one frame of picture is displayed, the first light emitting device is driven to emit light during a period of a first (½)t, and the second light emitting device is driven to emit light during a period of a second (½)t.

Compared with the pixel circuit in which one light emitting device is arranged in one pixel unit, the lifespan of the light emitting devices provided by the present disclosure can be at least doubled.

In general, the procedure of the pixel circuit driving the light emitting device to emit light includes at least two stages, i.e., a data signal writing stage and a light emitting stage. Before the first driving sub-circuit and the second driving sub-circuit drive the first light emitting device and the second light emitting device respectively, the charging sub-circuit is configured to charge the capacitor. When the capacitor is discharged, one of the first driving sub-circuit and the second driving sub-circuit drives the light emitting device connected thereto to emit light.

In the following, the pixel circuit, the display panel and the display apparatus provided in the embodiments of the present disclosure will be described in detail in connection with the accompanying drawings.

Figure 1:
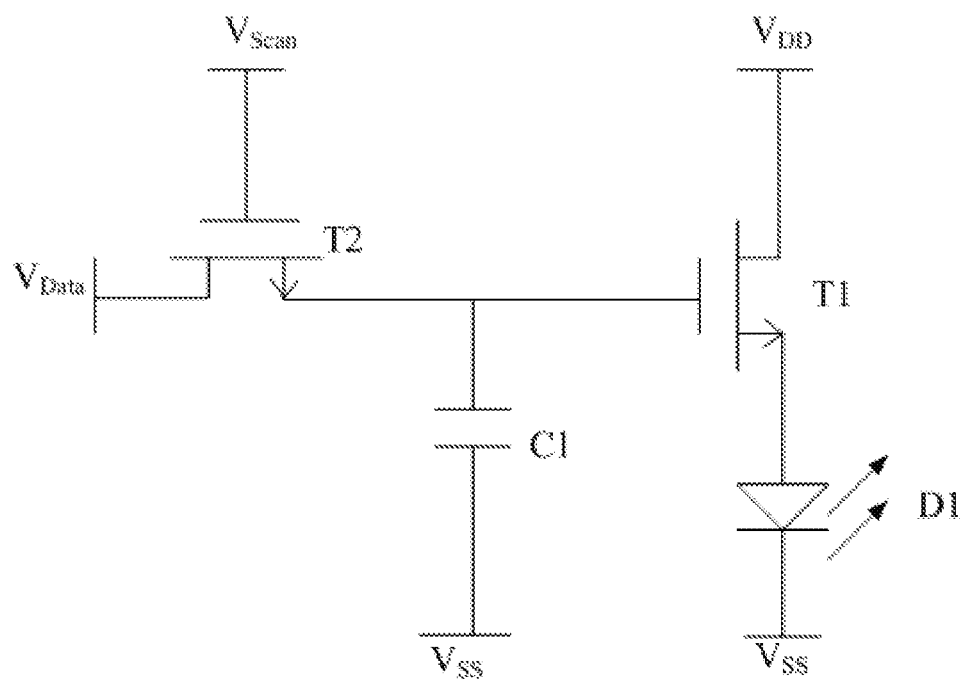
FIG. 1 is a structural schematic diagram of a pixel circuit in the prior art.
Figure 2:
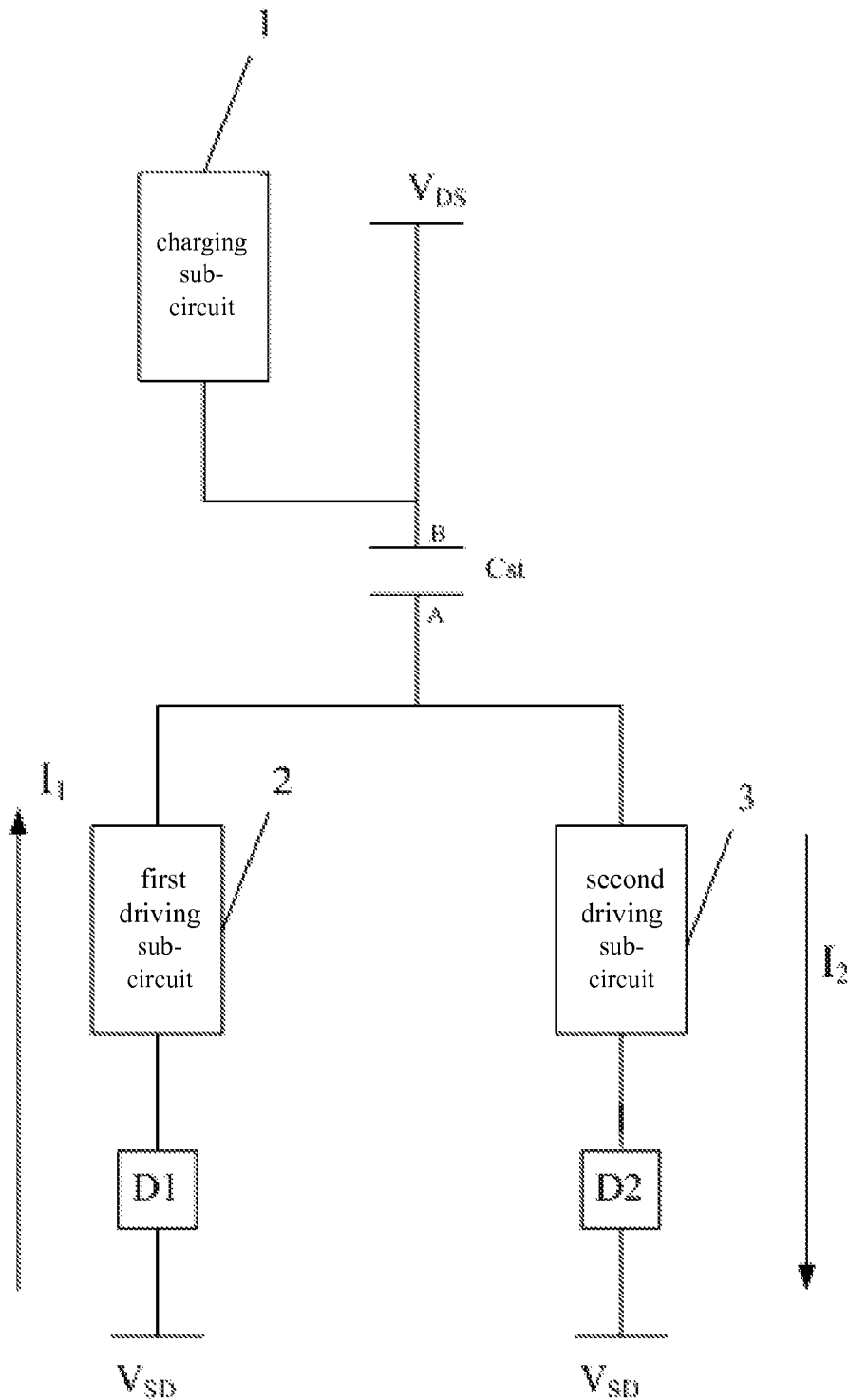
FIG. 2 is a first structural schematic diagram of a pixel circuit provided in embodiments of the present disclosure.

Referring to FIG. 2, the pixel circuit provided in the embodiments of the present disclosure comprises a charging sub-circuit 1, a capacitor Cst, a first driving sub-circuit 2 and a second driving sub-circuit 3.

A first terminal (terminal A) of the capacitor Cst is connected to a first terminal of the first driving sub-circuit 2 and a first terminal of the second driving sub-circuit 3, and a second terminal (terminal B) of the capacitor Cst is connected to the charging sub-circuit 1. A second terminal of the first driving sub-circuit 2 is connected to a first light emitting device D1, a second terminal of the second driving sub-circuit 3 is connected to a second light emitting device D2, and a driving current $I_1$ flowing to the first light emitting device D1 through the first driving sub-circuit 2 is in an opposite direction to a driving current $I_2$ flowing to the second light emitting device D2 through the second driving sub-circuit, the line segments with arrows in FIG. 2 represent the directions of the driving currents. The charging sub-circuit 1 is configured to charge the capacitor Cst, and when the capacitor is discharged, the first driving sub-circuit 2 drives the first light emitting device D1 to emit light or the second driving sub-circuit 3 drives the second light emitting device D2 to emit light.

Optionally, the light emitting device provided in the embodiments of the present disclosure can be OLED, other organic electroluminescent devices, or the like, which are not limited in the present disclosure.

In the following, the pixel circuit structure shown in FIG. 2 will be described in detail by taking the light emitting device being OLED as an example.

Figure 3:
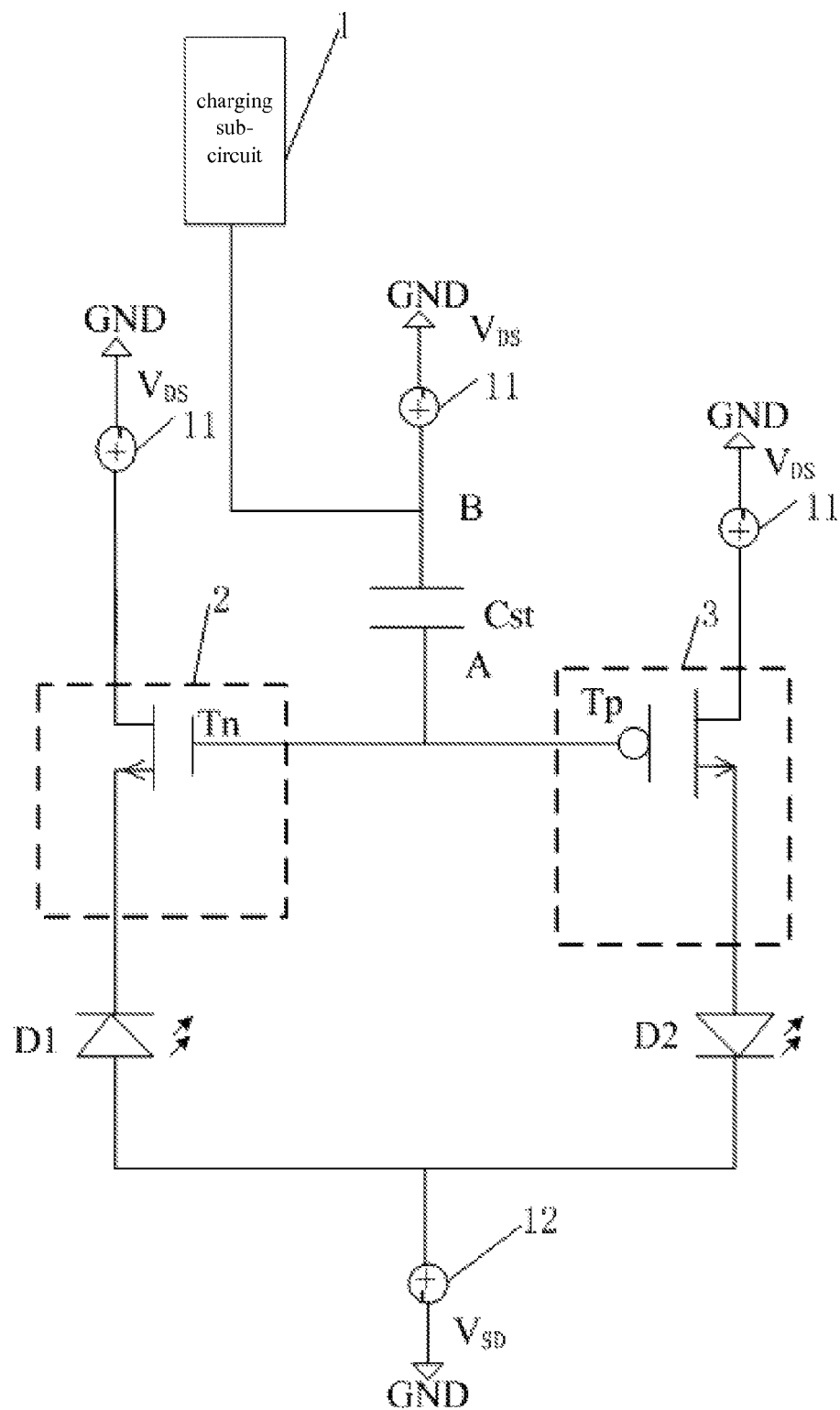
FIG. 3 is a second structural schematic diagram of a pixel circuit provided in the embodiments of the present disclosure.

Referring to FIG. 3, the pixel circuit comprises the first charging sub-circuit 1, and the first driving sub-circuit 2 and the second driving sub-circuit 3 connected to the charging sub-circuit 1. The first driving sub-circuit 2 is connected to the first light emitting device D1, and the second driving sub-circuit 3 is connected to the second light emitting device D2.

The first driving sub-circuit 2 comprises a n-type driving transistor Tn, and the second driving sub-circuit 3 comprises a p-type driving transistor Tp.

The gate of the n-type driving transistor Tn is connected to the first terminal (terminal A) of the capacitor Cst, the source of the n-type driving transistor is connected to an output terminal of a first reference voltage source 11 capable of supplying an alternate current (AC) signal, the drain of the n-type driving transistor is connected to the cathode of the first light emitting device D1, and the anode of the first light emitting device D1 is connected to an output terminal of a second reference voltage source 12 capable of supplying an alternate current signal.

The gate of the p-type driving transistor Tp is connected to the first terminal (terminal A) of the capacitor Cst, the source of the p-type driving transistor is connected to the output terminal of the first reference voltage source 11, the drain of the p-type driving transistor is connected to the anode of the second light emitting device D2, and the cathode of the second light emitting device D2 is connected to the output terminal of the second reference voltage source 12.

The second terminal (terminal B) of the capacitor Cst is connected to the output terminal of the first reference voltage source 11.

The charging sub-circuit 1 is connected to the second terminal (terminal B) of the capacitor Cst.

The charging sub-circuit 1 is configured to input a data signal to the capacitor Cst before the first driving sub-circuit 2 and the second driving sub-circuit 3 drive the first light emitting device D1 and the second light emitting device D2 respectively to emit light.

The first driving sub-circuit 2 and the second driving sub-circuit 3 are configured to drive the first light emitting device D1 and the second light emitting device D2 respectively to emit light after the capacitor Cst is discharged. The first light emitting device D1 and the second light emitting device D2 emit light alternately, and thus the lifespan of the first light emitting device D1 and the second light emitting device D2 is at least doubled.

In addition, as shown in FIG. 3, the first driving sub-circuit 2 and the second driving sub-circuit 3 share the first reference voltage source 11 and the second reference voltage source 12. Since the first driving sub-circuit 2 and the second driving sub-circuit 3 operate in different periods, the first reference voltage source 11 and the second reference voltage source 12 operate in a manner of time division, which can simplify the circuit structure. Upon implementation, the alternate operation of the first driving sub-circuit 2 and the second driving sub-circuit 3 can be realized by switching the level of the output voltage of the first reference voltage 11 with that of the output voltage of the second reference voltage 12.

It is noted that in the pixel circuit provided in the embodiments of the present disclosure, the number of the light emitting devices connected respectively to the first driving sub-circuit and the second driving sub-circuit is not limited to one, but each of the first light emitting device and the second light emitting device can be connected to a plurality of light emitting devices connected in series or in parallel, which is not limited here. The first driving sub-circuit and the second driving sub-circuit share one capacitor Cst, which can simplify the circuit structure. However, the number of the capacitors Cst is not limited to one, which is not limited here.

Referring to FIG. 3, it is presumed that a high level voltage of a voltage $V_{DS}$ output by the first reference voltage source 11 is $V_{dd}$, and a low level voltage thereof is $V_{ss}$. It is further presumed that a high level voltage of a voltage $V_{SD}$ output by the second reference voltage source 12 is $V_{dd}$, and a low level voltage thereof is $V_{ss}$. $V_{dd}$ is a positive value larger than zero, and $V_{ss}$ can be zero or a negative value smaller than zero.

In the embodiments of the present disclosure, when the first reference voltage source 11 outputs the high level voltage and the second reference voltage source 12 outputs the low level voltage, the branch where the second driving sub-circuit 3 is located is connected, and the branch where the first driving sub-circuit 2 is located is disconnected. When the first reference voltage source 11 outputs the low level voltage and the second reference voltage source 12 outputs the high level voltage, the branch where the second driving sub-circuit 3 is located is disconnected, and the branch where the first driving sub-circuit 2 is located is connected.

Figure 4:
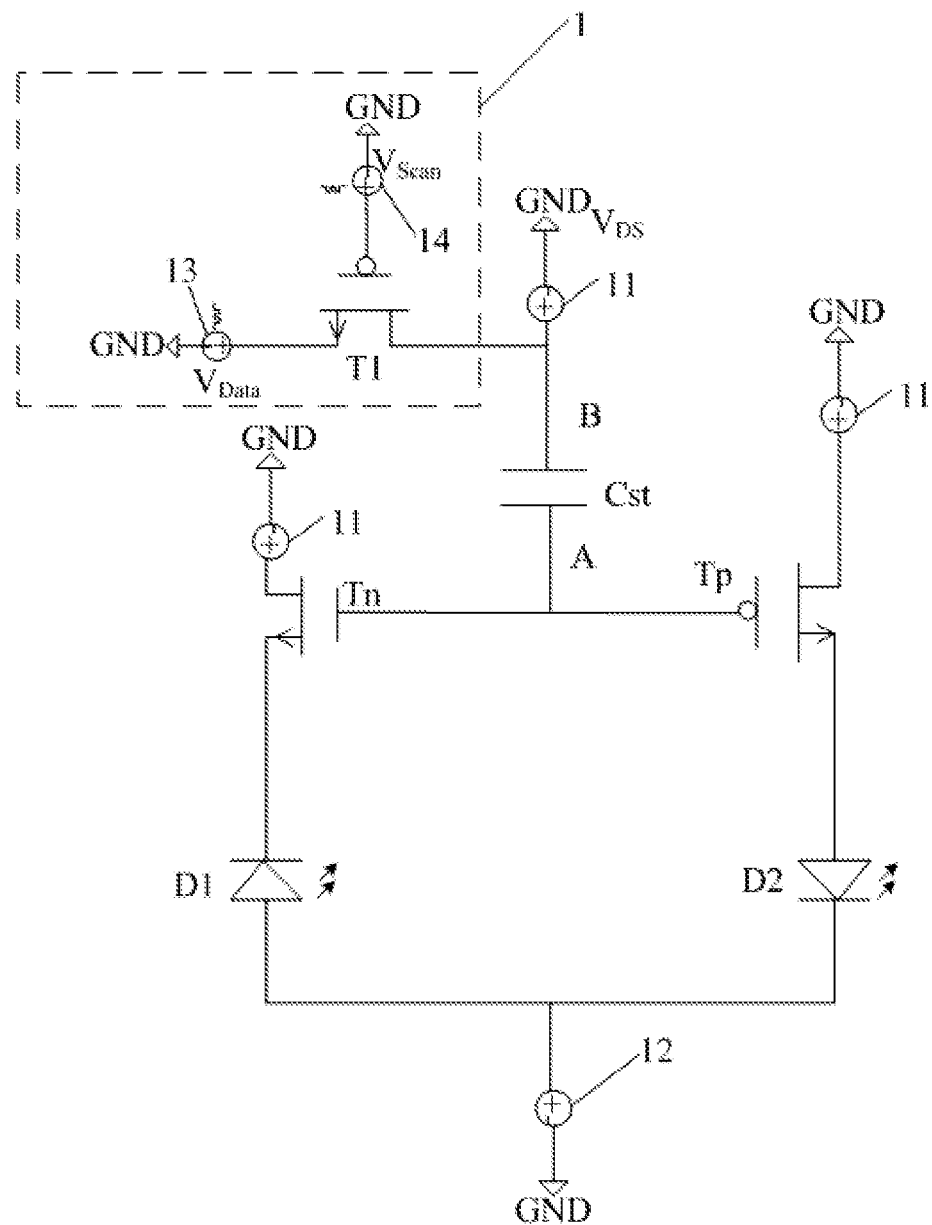
FIG. 4 is a third structural schematic diagram of a pixel circuit provided in the embodiments of the present disclosure.

Referring to FIG. 4, the charging sub-circuit 1 shown in FIG. 2 or FIG. 3 comprises a data signal source 13, a first gate signal source 14, and a first switching transistor T1 which is connected to the data signal source 13 and the first gate signal source 14.

In particular, the drain of the first switching transistor T1 is connected to an output terminal of the data signal source 13, the source of the first switching transistor is connected to the second terminal (terminal B) of the capacitor Cst, and the gate of the first switching transistor is connected to an output terminal of the first gate signal source 14. The first gate signal source 14 is configured to control the first switching transistor T1 to be turned on or off under the control of timing sequence. The data signal source 13 writes a data signal to the capacitor Cst through the first switching transistor T1 in a turn-on state under the control of the timing sequence.

In order that both the driving current for driving the first light emitting device D1 and the driving current for driving the second light emitting device D2 are irrelevant with the voltage $V_{DS}$ provided by the first reference voltage source 11 and the voltage $V_{SD}$ provided by the second reference voltage source 12 so as to avoid the change of the currents flowing through the light emitting devices caused by voltage drop IR Drop on the $V_{dd}$ or $V_{ss}$ signal lines due to load; and in order that the driving currents are irrelevant with the threshold voltage $V_{th1}$ of the n-type driving transistor $T_n$ and the threshold voltage $V_{th2}$ of the p-type driving transistor $T_p$ so as to avoid the light-emitting nonuniformity of respective pixels caused by the threshold voltage difference among different driving transistors, the pixel circuit provided in the embodiments of the present disclosure also comprises a compensation sub-circuit.

Figure 5:
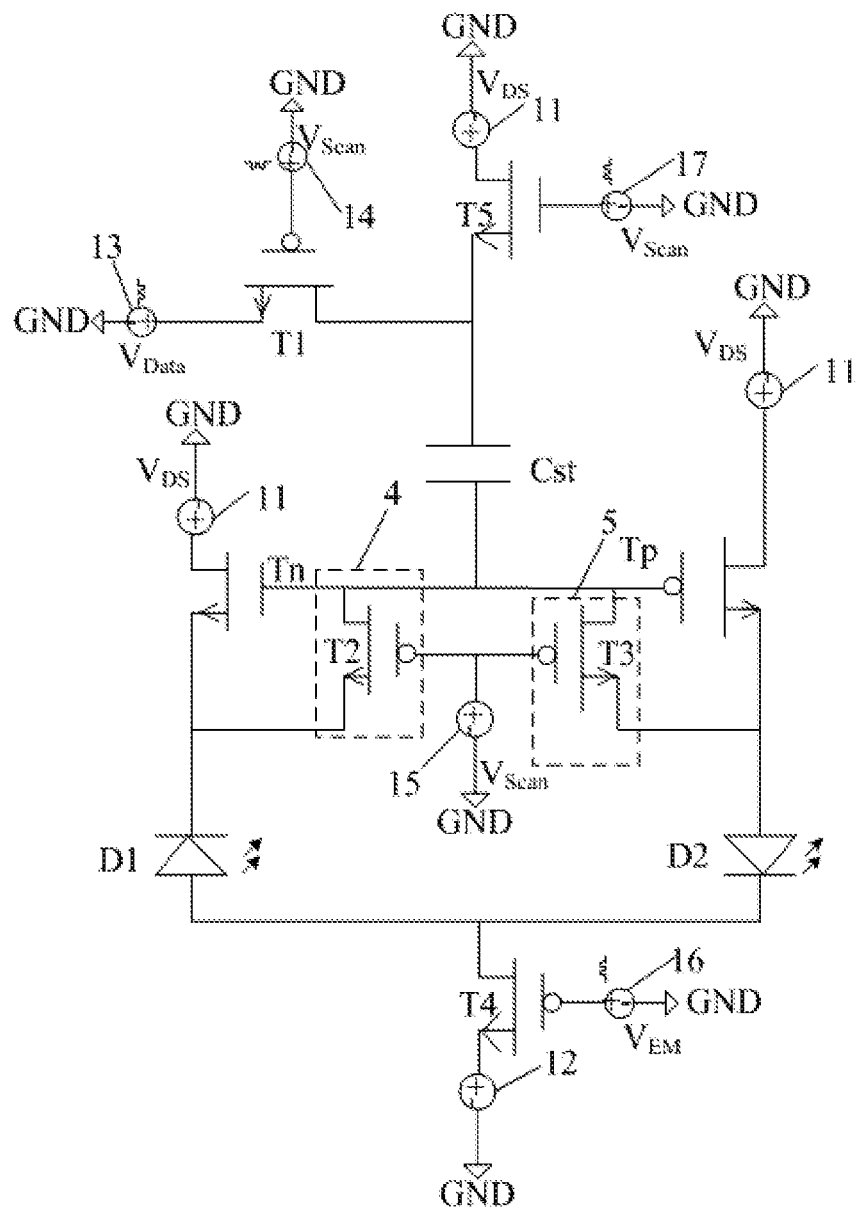
FIG. 5 is a fourth structural schematic diagram of a pixel circuit provided in the embodiments of the present disclosure.

Referring to FIG. 5, the pixel circuit provided in the embodiments of the present disclosure also comprises a first compensation sub-circuit 4 connected to the first driving sub-circuit 2, and a second compensation sub-circuit 5 connected to the second driving sub-circuit 3.

The first compensation sub-circuit 4 comprises a second switching transistor T2; the source of the second switching transistor T2 is connected to the gate of the n-type driving transistor Tn, the drain of the second switching transistor T2 is connected to the drain of the n-type driving transistor Tn, and the gate of the second switching transistor T2 is connected to an output terminal of a second gate signal source 15.

The second compensation sub-circuit 5 comprises a third switching transistor T3; the source of the third switching transistor T3 is connected to the gate of the p-type driving transistor Tp, the drain of the third switching transistor T3 is connected to the drain of the p-type driving transistor Tp, and the gate of the third switching transistor T3 is connected to the output terminal of the second gate signal source T15.

However, the second switching transistor T2 and the third switching transistor T3 can be connected to different gate signal sources respectively, i.e., respectively connected to gate signal sources independent from each other, and be controlled to be turned on or off respectively by the different gate signal sources.

Similarly, the first gate signal source 14 and the second gate signal source 15 can be the same gate signal source or different gate signal sources. When the first gate signal source 14 and the second gate signal source 15 are a same gate signal source, the first switching transistor T1, the second switching transistor T2 and the third switching transistor T3 are a same type of transistors (for example, all n-type or p-type transistors). The first switching transistor T1, the second switching transistor T2 and the third switching transistor T3 shown in FIG. 5 are all p-type transistors.

Referring to FIG. 5, in order to avoid the influence of the first reference voltage source 11 and the second voltage source 12 on the charging sub-circuit 1 at the writing stage, the pixel circuit also comprises a fourth switching transistor T4 and a fifth switching transistor T5.

The gate of the fourth switching transistor T4 is connected to an output terminal of a charging control signal source 16, the source of the fourth switching transistor T4 is connected to the anode of the first light emitting device D1 and the cathode of the second light emitting device D2, and the drain of the fourth switching transistor T4 is connected to the output terminal of the second reference voltage source 12. The charging control signal source 16, under the control of the timing sequence, controls the fourth switching transistor T4 to be turned on or off.

The gate of the fifth switching transistor T5 is connected to a third gate signal source 17, the source of the fifth switching transistor T5 is connected to the output terminal of the first reference voltage source 11, and the drain of the fifth switching transistor T5 is connected to the second terminal (terminal B) of the capacitor Cst. The third gate signal source 17, under the control of the timing sequence, controls the fifth switching transistor to be turned on or off.

Optionally, in order to simplify the circuit structure, the first gate signal source 14, the second signal source 15 and the third gate signal source 17 are a same gate signal source, i.e., share the same gate signal source; the first switching transistor, the second switching transistor and the third switching transistor are n-type transistors, and the fifth switching transistor is a p-type transistor; or the first switching transistor, the second switching transistor and the third switching transistor are p-type transistors, and the fifth switching transistor is a n-type transistor.

The charging control signal source 16 controls the fourth switching transistor T4 to be turned on or off independently.

Upon implementation, the first gate signal source 14, the second gate signal source 15 and the third gate signal source 17 are connected to respective transistors through gate lines. The data signal source 13 is connected to the first switching transistor T1 through a data line.

In the following, the method for driving the pixel circuit provided in the embodiments of the present disclosure will be described in detail.

During the period in which one frame of picture is displayed, the first driving sub-circuit 2 and the second driving sub-circuit 3 drive the first light emitting device D1 to emit light and the second light emitting device D2 to emit light respectively in sequence under the control of timing sequence.

Before the first driving sub-circuit 2 drives the first light emitting device D1 to emit light, the charging sub-circuit 1 charges the capacitor Cst, and when the capacitor Cst is discharged, the first driving sub-circuit 2 drives the first light emitting device D1 to emit light or the second driving sub-circuit 3 drives the second light emitting device D2 to emit light.

Although the case in which the first driving sub-circuit 2 and the second driving sub-circuit 3 drive the first light emitting device D1 to emit light and the second light emitting device D2 to emit light respectively in sequence under the control of timing sequence is described here, the embodiments of the present disclosure are not limited thereto. It is also possible that the second driving sub-circuit 3 and the first driving sub-circuit 2 drive the second light emitting device D2 to emit light and the first light emitting device D1 to emit light respectively in sequence under the control of timing sequence, and before the second driving sub-circuit 3 drives the second light emitting device D2 to emit light, the charging sub-circuit 1 charges the capacitor Cst, and when the capacitor Cst is discharged, the first driving sub-circuit 2 drives the first light emitting device D1 to emit light or the second driving sub-circuit 3 drives the second light emitting device D2 to emit light.

Optionally, when the first reference voltage source 11 is controlled to output a high level and the second reference voltage source 12 is controlled to output a low level, the branch where the first driving sub-circuit 2 is located is disconnected, the branch where the second driving sub-circuit 3 is located is connected, and the second driving sub-circuit 3 drives the second light emitting device D2 to emit light.

When the first reference voltage source 11 is controlled to output the low level and the second reference voltage source 12 is controlled to output the high level, the branch where the second driving sub-circuit 3 is located is disconnected, the branch where the first driving sub-circuit 2 is located is connected, and the first driving sub-circuit 2 drives the first light emitting device D1 to emit light.

In particular, the operation that the first driving sub-circuit 2 is controlled to drive the first light emitting device D1 to emit light comprises the following stages.

During a reset stage, the first gate signal source 14, the second gate signal source 15 and the third gate signal source 17 control the first switching transistor T1, the second switching transistor T2 and the third switching transistor T3 to be turned on and the fifth switching transistor T5 to be turned off, respectively, and the charging control signal source 16 controls the fourth switching transistor T4 to be turned on. The first reference voltage source 11 outputs the low level and the second voltage source 12 outputs the high level, such that the branch where the first light emitting device D1, the n-type driving transistor Tn and the capacitor Cst are located is connected. The voltage output by the data signal source 13 and the voltage output by the second reference voltage source 12 are applied to the two terminals of the capacitor Cst, such that the voltage between the two terminals of the capacitor Cst is reset.

During a writing stage, the first gate signal source 14, the second gate signal source 15 and the third gate signal source 17 control the first switching transistor T1, the second switching transistor T2 and the third switching transistor T3 to be turned on and the fifth switching transistor T5 to be turned off, respectively, and the charging control signal source 16 controls the fourth switching transistor T4 to be turned off. The first reference voltage source 11 outputs the low level and the second voltage source 12 outputs the high level, such that the branch where the n-type driving transistor Tn and the capacitor Cst are located is connected. The voltage output by the data signal source 13 is applied to one terminal of the capacitor Cst, and the capacitor Cst stores the data signal.

During a light emitting stage, the first gate signal source 14, the second gate signal source 15 and the third gate signal source 17 control the first switching transistor T1, the second switching transistor T2 and the third switching transistor T3 to be turned off and the fifth switching transistor T5 to be turned on, respectively, and the charging control signal source 16 controls the fourth switching transistor T4 to be turned on. The first reference voltage source 11 outputs the low level and the second voltage source 12 outputs the high level, such that the branch where the n-type driving transistor Tn, the capacitor Cst and the first light emitting device D1 are located is connected. The capacitor Cst is discharged, and the first driving sub-circuit 2 drives the first light emitting device D1 to emit light.

In particular, the operation that the second driving sub-circuit 3 is controlled to drive the second light emitting device D2 to emit light comprises the following stages.

During a reset stage, the first gate signal source 14, the second gate signal source 15 and the third gate signal source 17 control the first switching transistor T1, the second switching transistor T2 and the third switching transistor T3 to be turned on and the fifth switching transistor T5 to be turned off, respectively, and the charging control signal source 16 controls the fourth switching transistor T4 to be turned on. The first reference voltage source 11 outputs the high level and the second voltage source 12 outputs the low level, such that the branch where the second light emitting device D2, the p-type driving transistor Tp and the capacitor Cst are located is connected. The voltage output by the data signal source 13 and the voltage output by the first reference voltage source 111 are applied to the two terminals of the capacitor Cst, such that the voltage between the two terminals of the capacitor Cst is reset.

During a writing stage, the first gate signal source 14, the second gate signal source 15 and the third gate signal source 17 control the first switching transistor T1, the second switching transistor T2 and the third switching transistor T3 to be turned on and the fifth switching transistor T5 to be turned off, respectively, and the charging control signal source 16 controls the fourth switching transistor T4 to be turned off. The first reference voltage source 11 outputs the high level and the second voltage source 12 outputs the low level, such that the branch where the p-type driving transistor Tp and the capacitor Cst are located is connected. The voltage output by the data signal source 13 is applied to one terminal of the capacitor Cst, such that the capacitor Cst stores the data signal.

During a light emitting stage, the first gate signal source 14, the second gate signal source 15 and the third gate signal source 17 control the first switching transistor T1, the second switching transistor T2 and the third switching transistor T3 to be turned off and the fifth switching transistor T5 to be turned on, respectively, and the charging control signal source 16 controls the fourth switching transistor T4 to be turned on. The first reference voltage source 11 outputs the high level and the second voltage source 12 outputs the low level, such that the branch where the p-type driving transistor Tp, the capacitor Cst and the second light emitting device D2 are located is connected. The capacitor Cst is discharged, such that the second driving sub-circuit 3 drives the second light emitting device D2 to emit light.

In the following, the operating principle of the pixel circuit provided by an embodiment of the present disclosure will be described in detail in connection with the pixel circuit shown in FIG. 5 and the timing sequence diagram of the operation of the pixel circuit shown in FIG. 6.

It is presumed that the first gate signal source 14, the second gate signal source 15, and the third gate signal source 17 are a same gate signal source, and output a voltage signal $V_{Scan}$.

It is presumed that the charging control signal source 16 outputs a voltage signal $V_{EM}$.

Description will be given by taking the case in which the first switching transistor T1, the second switching transistor T2, the third switching transistor T3 and the fourth switching transistor T4 are p-type transistors and the fifth transistor T5 is a n-type transistor as an example.

The n-type transistor is turned on when a high level voltage is input to the gate thereof, and turned off when a low level voltage is input to the gate thereof. The p-type transistor is turned on when a low level voltage in input to the gate thereof, and turned off when a high level voltage is input to the gate thereof.

It is presumed that $V_{dd}$ is a positive value higher than GND, and $V_{ss}$ is a negative value lower than GND.

In the following, the operating principle of the pixel circuit driving the first light emitting device D1 to emit light will be described.

Figure 6:
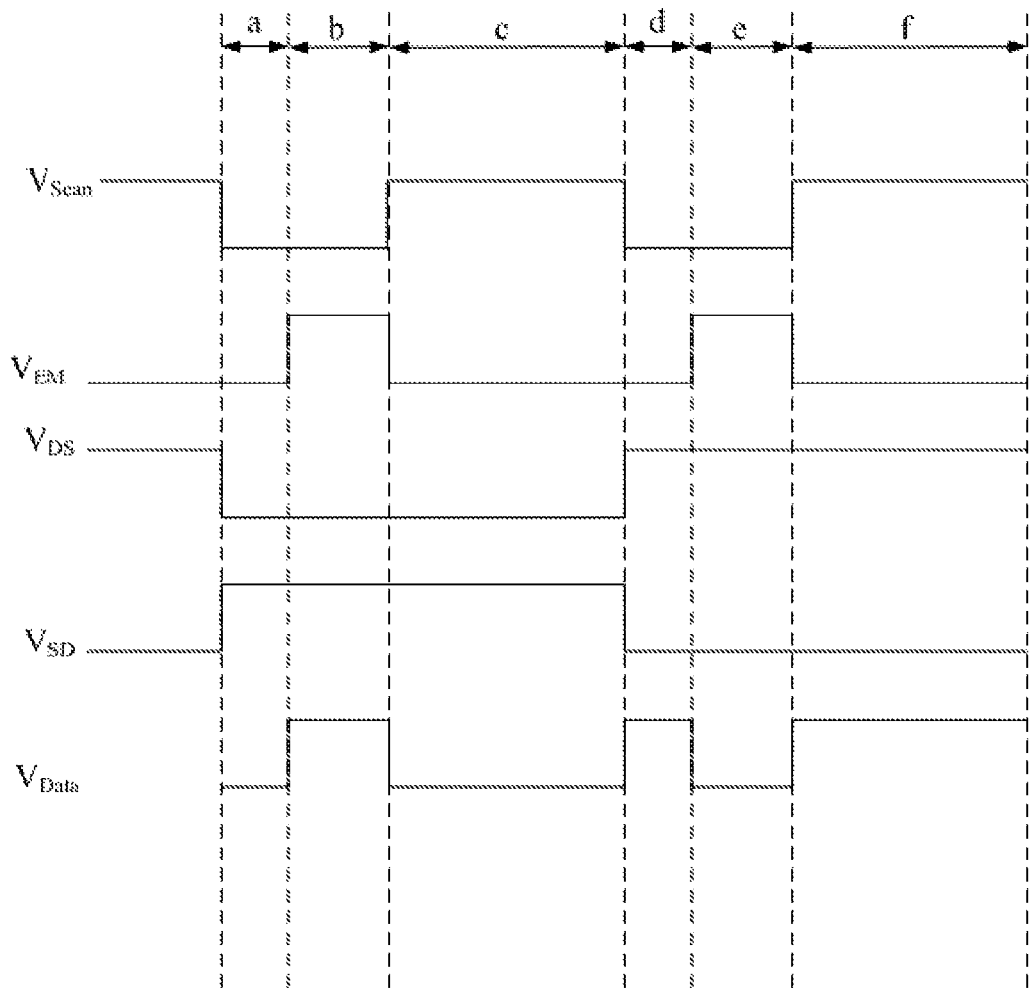
FIG. 6 is a timing diagram of the operation of the pixel circuit shown in FIG. 5 provided in the embodiments of the present disclosure.

FIG. 6 shows the reset stage (stage a), the writing stage (stage b) and the light emitting stage (stage c) corresponding to the case in which the first light emitting device D1 is driven to emit light, and the reset stage (stage d), the writing stage (stage e) and the light emitting stage (stage f) corresponding to the case in which the second light emitting device D2 is driven to emit light.

Stage a: The Reset Stage

As shown in FIG. 6, the first gate signal source 14 shown in FIG. 5 outputs the voltage $V_{Scan}$ at a low level, the first switching transistor T1, the second switching transistor T2 and the third switching transistor T3 connected to the first gate signal source 14 are turned on under the control of the voltage at the low level, and the fifth switching transistor T5 connected to the third gate signal source 17 (the third gate signal source 17 and the first gate signal source 14 are the same signal source) is turned off.

When the second switching transistor T2 is turned on, the gate and the drain of the n-type driving transistor Tn connected to the second switching transistor T2 are connected. At this time, the n-type driving transistor Tn is equivalent to a diode. When the third switching transistor T3 is turned on, and the gate and the drain of the p-type driving transistor Tp connected to the third switching transistor T3 are connected. At this time, the p-type driving transistor Tp is equivalent to a diode.

The voltage $V_{EM}$ output by the charging control signal source 16 is at the low level, and the fourth switching transistor T4 connected to the charging control signal source 16 is turned on.

The first reference voltage source 11 outputs a low level voltage $V_{ss}$, and the second reference voltage source 12 outputs a high level voltage $V_{dd}$. The p-type driving transistor Tp is turned off, and the branch where the p-type driving transistor Tp is located is disconnected. The n-type driving transistor Tn is turned on, and the branch where the n-type driving transistor is located is connected.

The data signal source 13 outputs the data voltage signal $V_{Data}$ at the low level.

Figure 7:
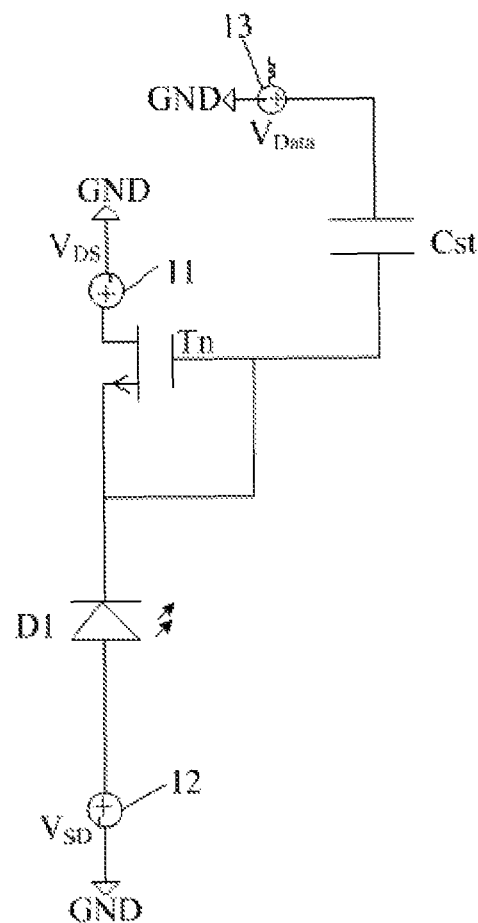
FIG. 7 is a structural schematic diagram of a first driving sub-circuit with reset function in a pixel circuit provided in the embodiments of the present disclosure.

At this time, the pixel circuit shown in FIG. 5 is equivalent to the circuit structure shown in FIG. 7.

The branch where the first light emitting device D1, the n-type driving transistor Tn, the capacitor Cst and the data signal source 13 are located is connected. The voltage $V_{Data}$ of the data signal source 13 and the voltage $V_{DD}$ of the second reference voltage source 12 are applied to the two terminals of the capacitor Cst respectively, and the voltage between the two terminals of the capacitor Cst is $V_{DD}-V_{Data}$.

Stage b: The Writing Stage

As shown in FIG. 6, the first gate signal source 14 shown in FIG. 5 outputs the voltage $V_{Scan}$ at the low level, the first switching transistor T1, the second switching transistor T2 and the third switching transistor T3 connected to the first gate signal source 14 are turned on, and the fifth switching transistor T5 connected to the third gate signal source 17 (the third gate signal source 17 and the first gate signal source 14 are the same signal source) is turned off.

The second switching transistor T2 connects the gate and the drain of the n-type driving transistor Tn, and the n-type driving transistor Tn is equivalent to a diode.

The voltage $V_{EM}$ output by the charging control signal source 16 is at the high level, and the fourth switching transistor T4 connected to the charging control signal source 16 is turned off.

The voltage $V_{is}$ output by the first reference voltage source 11 is the low level voltage $V_{ss}$, and the voltage $V_{SD}$ output by the second reference voltage source 12 is the high level voltage $V_{dd}$.

The branch where the first reference voltage source 11, the n-type driving transistor Tn and the data signal source 13 are located is connected.

Figure 8:
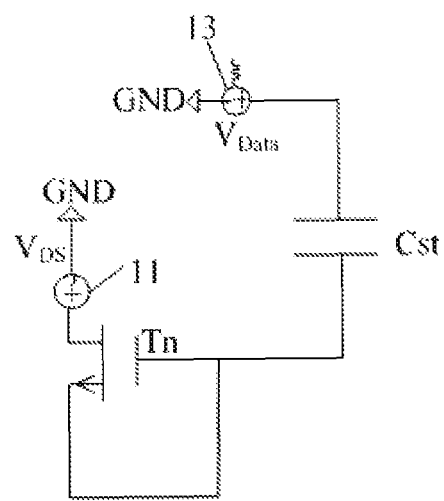
FIG. 8 is a structural schematic diagram of a first driving sub-circuit with charging function in a pixel circuit provided in the embodiments of the present disclosure.

At this time, the pixel circuit shown in FIG. 5 is equivalent to the circuit structure shown in FIG. 8.

The capacitor Cst is discharged through the n-type driving transistor Tn until the n-type driving transistor Tn is turned off. At this time, the voltage between the gate and the source of the n-type driving transistor Tn is $V_{gs}=V_{th1}$, where $V_{th1}$ is the threshold voltage between the gate and the source of the n-type driving transistor Tn, and the voltage between the two terminals of the capacitor Cst is $V_{ss}+V_{th1}-V_{Data}$. At this time, the data signal $V_{Data}$ and the threshold voltage $V_{th1}$ of the n-type driving transistor Tn are written into the capacitor Cst.

Stage c: The Light Emitting Stage

As shown in FIG. 6, the first gate signal source 14 shown in FIG. 5 outputs the voltage $V_{Scan}$ at the high level, the first switching transistor T1, the second switching transistor T2 and the third switching transistor T3 connected to the first gate signal source 14 are turned off, and the fifth switching transistor T5 connected to the third gate signal source 17 (the third gate signal source 17 and the first gate signal source 14 are the same signal source) is turned on.

The voltage $V_{EM}$ output by the charging control signal source 16 is at the low level, and the fourth switching transistor T4 connected to the charging control signal source 16 is turned on.

The voltage $V_{DS}$ output by the first reference voltage source 11 is the low level voltage $V_{ss}$, and the voltage $V_{SD}$ output by the second reference voltage source 12 is the high level voltage $V_{dd}$. The branch where the capacitor Cst and the data signal source 13 are located is disconnected, and the branch where the Cst, the n-type driving transistor Tn and the first light emitting device D1 are located is connected.

Figure 9:
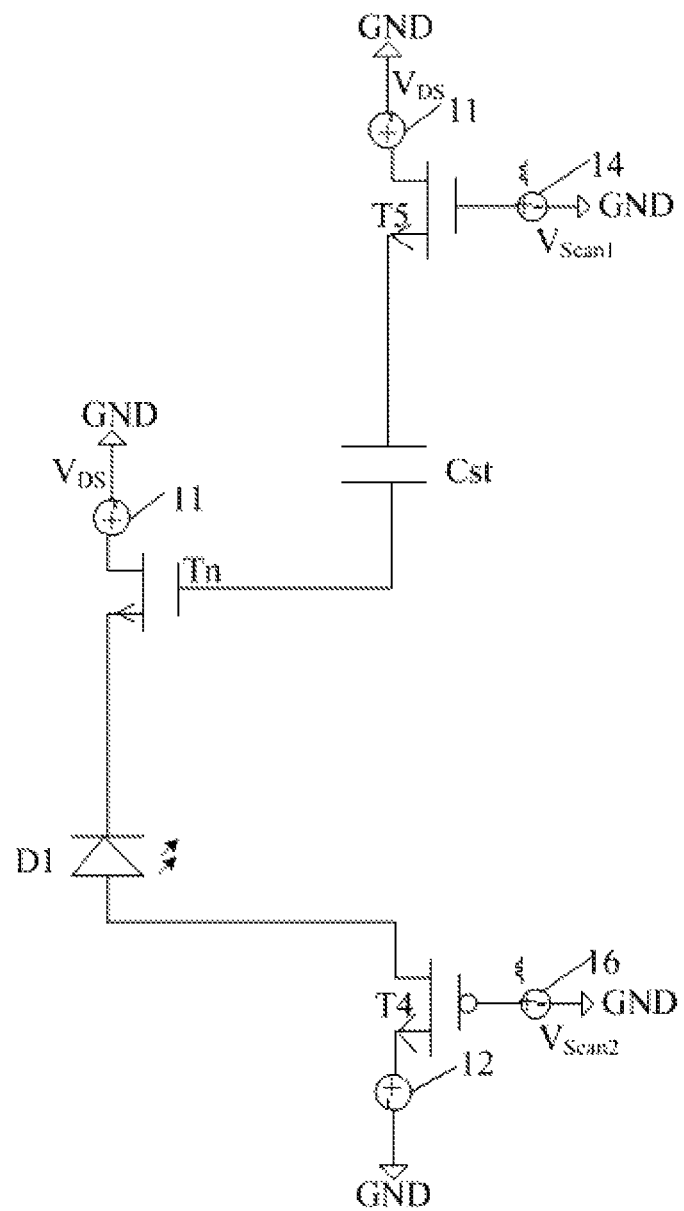
FIG. 9 is a structural schematic diagram of a first driving sub-circuit with a function of driving the light emitting device to emit light in a pixel circuit provided in the embodiments of the present disclosure.

At this time, the pixel circuit shown in FIG. 5 is equivalent to the circuit structure shown in FIG. 9.

As shown in FIG. 9, the second terminal of the capacitor Cst is connected to the first reference voltage source 11 (outputting the low level voltage $V_{ss}$), the first terminal of the capacitor Cst is connected to the gate of the n-type driving transistor Tn, the gate voltage of the n-type driving transistor Tn is $V_g=2V_{ss}+V_{th1}-V_{Data}$, and the source voltage of the n-type driving transistor Tn is $V_s=V_{ss}$. The voltage between the gate and the source of the n-type driving transistor Tn is $V_{gs}=V_g-V_s=V_{ss}+V_{th1}-V_{Data}$.

Since the n-type driving transistor Tn operates in a saturation state, according to the current characteristics of the saturation state, the drain-source current of the n-type driving transistor Tn satisfies the following equation:

$$i_{dn} = \frac{K}{2}(V_{gs} - V_{th1})^2,$$

where $i_{dn}$ is the drain-source current of the n-type driving transistor Tn, $V_{gs}$ is the voltage between the gate and the source of the n-type driving transistor Tn, K is a structural parameter which is relatively stable for the same structure, and $V_{th1}$ is the threshold voltage of the n-type driving transistor Tn. By bringing $V_{gs}=V_{th1}-V_{Data}$ into the equation $$i_{dn} = \frac{K}{2}(V_{gs} - V_{th1})^2,$$

we can get $$i_{dn} = \frac{K}{2}(V_{ss} - V_{DATA})^2.$$

If the low level voltage $V_{ss}$ is zero, then $$i_{dn} = \frac{K}{2}(-V_{DATA})^2.$$

It can be seen that the drain-source current $i_{dn}$ flowing through the n-type driving transistor Tn is only related to the voltage signal $V_{Data}$ provided by the data signal source 13, and irrelevant with $V_{th1}$ and $V_{dd}$. That is, the pixel circuit has the function of compensating $V_{th1}$ and $V_{dd}$. The drain-source current $i_{dn}$ drives the first light emitting device D1 to emit light. The current flowing through D1 would not be different due to the nonuniformality of the threshold voltage $V_{th1}$ of the n-type driving transistor Tn caused by the manufacture process, and would not be different due to the IR Drop of the $V_{dd}$ caused by the load on the $V_{dd}$ signal line.

In the following, the operating principle of the pixel circuit driving the second light emitting device D2 to emit light will be described.

When the second light emitting device D2 is driven to emit light, the timing diagram of respective signal sources in the pixel circuit is the same as the timing diagram of driving the first light emitting device D1 to emit light. The difference is that the voltage $V_{DS}$ output by the first reference voltage source 11 is switched to the high level voltage $V_{dd}$ from the low level voltage $V_{ss}$, and the voltage $V_{SD}$ output by the second reference voltage source 12 is switched to the low level voltage $V_{ss}$ from the high level voltage $V_{dd}$.

Stage d: The Reset Stage

As shown in FIG. 6, the first gate signal source 14 shown in FIG. 5 outputs the voltage $V_{Scan}$ at the low level, the first switching transistor T1, the second switching transistor T2 and the third switching transistor T3 connected to the first gate signal source 14 are turned on, and the fifth switching transistor T5 is turned off.

The third switching transistor T3 is turned on, and the gate and the drain of the p-type driving transistor Tp connected to the third switching transistor T3 are connected. At this time, the p-type driving transistor Tp is equivalent to a diode.

The voltage $V_{EM}$ output by the charging control signal source 16 is at the low level, and the fourth switching transistor T4 connected to the charging control signal source 16 is turned on.

The data signal source 13 outputs the data voltage signal $V_{Data}$.

The first reference voltage source 11 outputs the high level voltage $V_{dd}$, and the second reference voltage source 12 outputs the low level voltage $V_{ss}$. The branch where the n-type driving transistor Tn is located is disconnected. The branch where the p-type driving transistor, the second light emitting device D2 and the data signal source 13 are located is connected.

Figure 10:
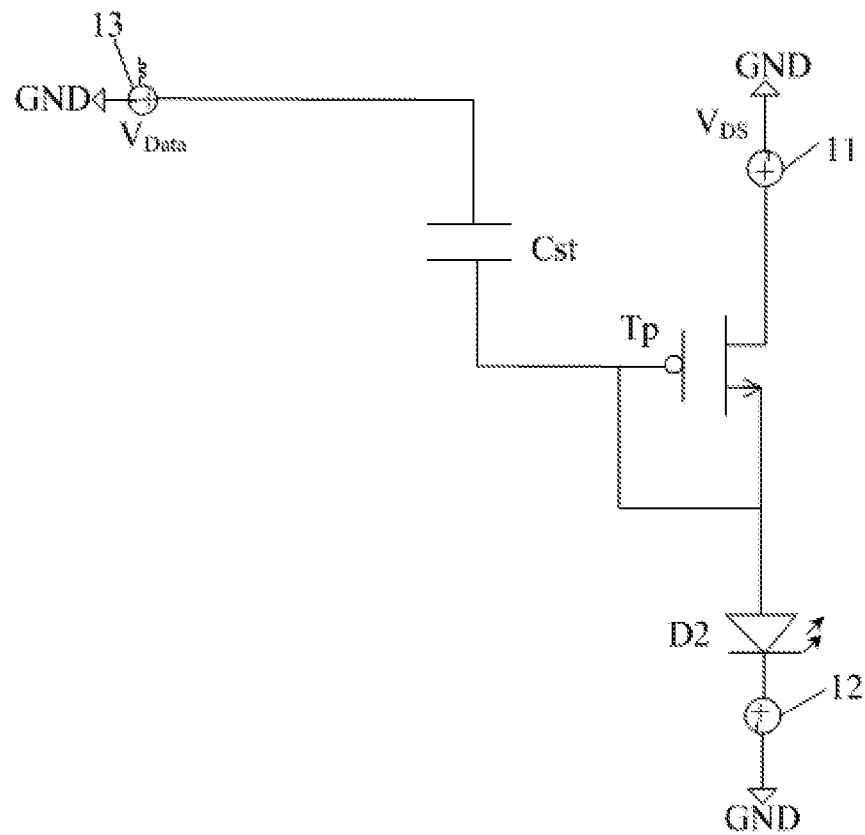
FIG. 10 is a structural schematic diagram of a second driving sub-circuit with reset function in a pixel circuit provided in the embodiments of the present disclosure.

At this time, the pixel circuit shown in FIG. 5 is equivalent to the circuit structure shown in FIG. 10.

The voltage $V_{Data}$ output by the data signal source 13 and the voltage $V_{ss}$ output by the second reference voltage source 12 are applied to the two terminals of the capacitor Cst respectively, and thus the voltage between the two terminals of the capacitor Cst is $V_{ss}-V_{Data}$.

Stage e: The Writing Stage

As shown in FIG. 6, the first gate signal source 14 shown in FIG. 5 outputs the voltage $V_{Scan}$ at the low level, the first switching transistor T1, the second switching transistor T2 and the third switching transistor T3 connected to the first gate signal source 14 are turned on, and the fifth switching transistor T5 is turned off.

The third switching transistor T3 connects the gate and the drain of the p-type driving transistor Tp, and the p-type driving transistor Tp is equivalent to a diode.

The voltage $V_{EM}$ output by the charging control signal source 16 is at the high level, and the fourth switching transistor T4 connected to the charging control signal source 16 is turned off.

Figure 11:
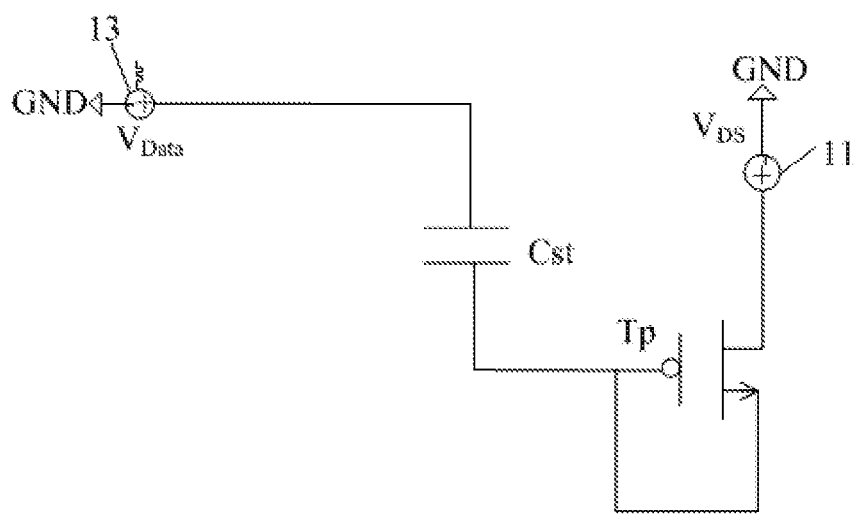
FIG. 11 is a structural schematic diagram of a second driving sub-circuit with charging function in a pixel circuit provided in the embodiments of the present disclosure.

At this time, the pixel circuit shown in FIG. 5 is equivalent to the circuit structure shown in FIG. 11.

The capacitor Cst is charged through the p-type driving transistor Tp until the p-type driving transistor Tp is turned off. At this time, the voltage between the gate and the source of the p-type driving transistor Tp is the threshold voltage $V_{th2}$ of the p-type driving transistor Tp, and thus the voltage between the two terminals of the capacitor Cst is $V_{ss}+V_{th2}-V_{Data}$. At this time, the data signal $V_{Data}$ and the threshold voltage $V_{th2}$ of the p-type driving transistor Tp are written into the capacitor Cst.

Stage f: The Light Emitting Stage

As shown in FIG. 6, the first gate signal source 14 shown in FIG. 5 outputs the voltage $V_{Scan}$ at the high level, the first switching transistor T1, the second switching transistor T2 and the third switching transistor T3 connected to the first gate signal source 14 are turned off, and the fifth switching transistor T5 being a n-type transistor is turned on under the control of the signal at the high level.

The voltage $V_{EM}$ output by the charging control signal source 16 is at the low level, and the fourth switching transistor T4 connected to the charging control signal source 16 is turned on.

The voltage $V_{DS}$ output by the first reference voltage source 11 is the high level voltage $V_{dd}$, and the voltage $V_{SD}$ output by the second reference voltage source 12 is the low level voltage $V_{ss}$.

Figure 12:
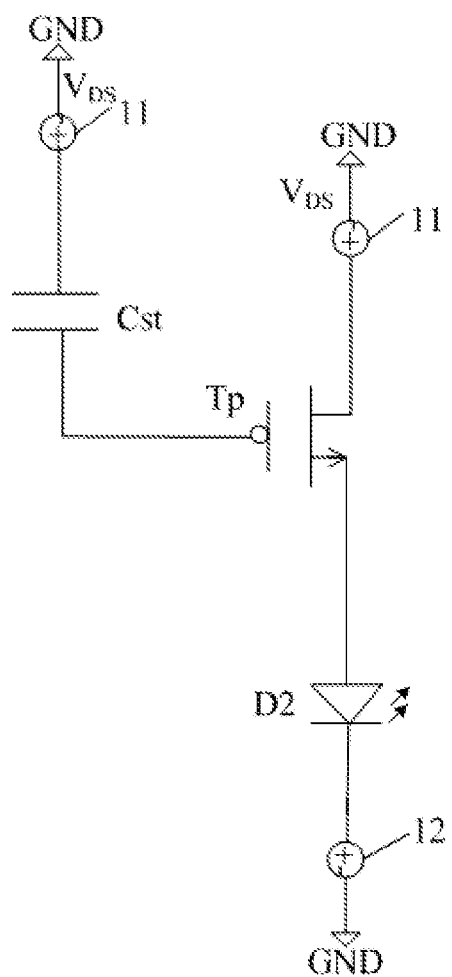
FIG. 12 is a structural schematic diagram of a second driving sub-circuit with a function of driving the light emitting device to emit light in a pixel circuit provided in the embodiments of the present disclosure.

At this time, the pixel circuit shown in FIG. 5 is equivalent to the circuit structure shown in FIG. 12.

As shown in FIG. 12, the second terminal of the capacitor Cst is connected to the first reference voltage source 11 (outputting the high level voltage), the first terminal of the capacitor Cst is connected to the gate of the p-type driving transistor Tp, the gate voltage of the p-type driving transistor Tp is $V_g=V_{dd}+V_{ss}+V_{th2}-V_{Data}$, and the source voltage of the p-type driving transistor Tp is $V_s=V_{dd}$. The voltage between the gate and the source of the p-type driving transistor Tp is $V_{gs}=V_g-V_s=V_{dd}+V_{ss}+V_{th2}-V_{Data}-V_{dd}-V_{ss}+V_{th2}-V_{Data}$.

Since the p-type driving transistor Tp operates in a saturation state, according to the current characteristics of the saturation state, the drain-source current of the p-type driving transistor Tp satisfies the following equation:

$$i_{dp} = \frac{K}{2}(V_{gs} - V_{thp})^2,$$

where $i_p$ is the drain-source current of the p-type driving transistor Tp, $V_{gs}$ is the voltage between the gate and the source of the p-type driving transistor Tp, K is a structural parameter which is relatively stable for the same structure, and $V_{th2}$ is the threshold voltage of the p-type driving transistor Tp. By bringing $V_{gs}=V_{th2}-V_{Data}$ into the equation $$i_{dp} = \frac{K}{2}(V_{gs} - V_{th2})^2,$$

we can get $$i_{dp} = \frac{K}{2}(V_{ss} - V_{Data})^2.$$

If the low level voltage $V_{ss}$ is zero, then $$i_{dp} = \frac{K}{2}(-V_{Data})^2.$$

It can be seen that the drain-source current $i_{dp}$ flowing through the p-type driving transistor Tp is only related to the voltage signal $V_{Data}$ provided by the data signal source 13, and irrelevant with $V_{th2}$ and $V_{dd}$. The drain-source current $i_{dp}$ drives the second light emitting device D2 to emit light. The current flowing through D2 would not be different due to the nonuniformality of the threshold voltage $V_{th2}$ of the p-type driving transistor Tp caused by the manufacture process, and would not be different due to the IR Drop of the $V_{dd}$ caused by the load on the $V_{dd}$ signal line.

Figure 13:
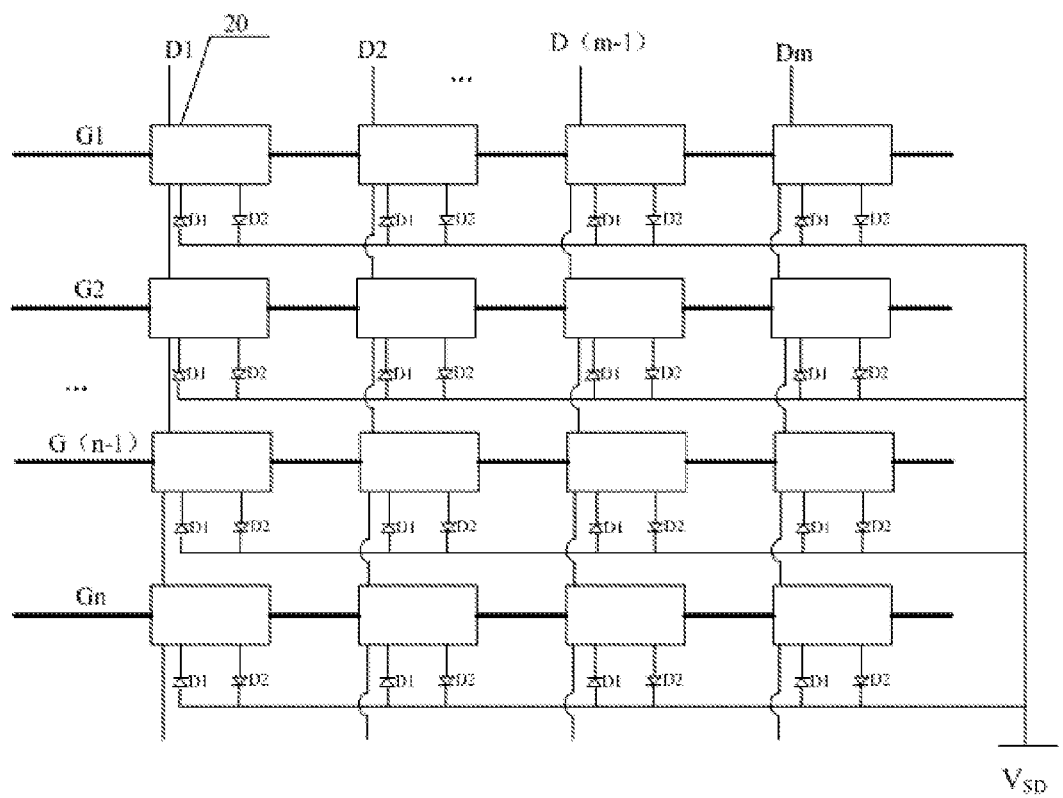
FIG. 13 a structural schematic diagram of an organic light-emitting display panel provided in the embodiments of the present disclosure.

The display panel provided in the embodiments of the present disclosure is shown in FIG. 13. The display panel comprises a plurality of gate lines arranged in the row direction, such as G1, G2, . . . , Gn shown in FIG. 13, a plurality of data lines arranged in the column direction, such as D1, D2, . . . , Dn shown in FIG. 13, and a plurality of pixel units surrounded by adjacent gate lines and data lines.

Each of the pixel units comprises one pixel circuit 20 provided in the embodiments of the present disclosure and a first light emitting device D1 and a second light emitting device D2 connected to the pixel circuit 20.

The pixel circuits 20 located in a same row are connected to one and the same gate line, and the pixel circuit 20 located in a same column are connected to one and the same data line.

The charging sub-circuits in the pixel circuits located in a same row are connected to one and the same gate line, the charging sub-circuits in the pixel circuits located in a same column are connected to one and the same data line. During a period in which one frame of picture is displayed, before the first driving sub-circuits and the second driving sub-circuits drive the first light emitting devices to emit light and the second light emitting devices to emit light respectively in sequence, the charging sub-circuits charge the capacitors through the data line and the gate line.

In particular, the drain of the first switching transistor in the charging sub-circuit is connected to the data signal source through the data line, and the gate of the first switching transistor is connected to the first gate signal source through the gate line. The gate signal source and the data signal source charge the capacitor through the gate line and the data line respectively.

The display apparatus provided in the embodiments of the present disclosure comprises the above display panel. The display apparatus can be an organic electroluminescent display OLED panel, an OLED display, an OLED TV, an electronic paper or the like.

In the embodiments of the present disclosure, the alternate current signals provided by the first reference voltage source, the second reference voltage source, the first gate signal source, the data signal source and the charging control signal source change with the change of the timing sequence.

In conclusion, according to the present disclosure, a first light emitting device and a second light emitting device are arranged in each pixel area, the operating current of the first light emitting device is in the opposite direction to that of the second light emitting device, and the first light emitting device and the second light emitting device are driven to emit light by a n-type driving transistor and a p-type driving transistor respectively. The first light emitting device and the second light emitting device emit light alternately, such that the lifespan of the light emitting devices is at least doubled.

It is obvious that those skilled in the art may make various modifications and variations to the above embodiments without departing the spirit and scope of the present disclosure as defined by the following claims. Such variations and modifications are intended to be included within the scope of the present disclosure if they fall in the scope of the claims of the present disclosure and equivalents thereof.

What is claimed is:

1. A pixel circuit comprising a charging sub-circuit, a capacitor, a first driving sub-circuit and a second driving sub-circuit different from the first driving sub-circuit, wherein
    a first terminal of the capacitor is connected to a first terminal of the first driving sub-circuit and a first terminal of the second driving sub-circuit, and a second terminal of the capacitor is connected to the charging sub-circuit, wherein the first terminal of the capacitor is different from the second terminal of the capacitor;
    a second terminal of the first driving sub-circuit is connected to a first light emitting device, a second terminal of the second driving sub-circuit is connected to a second light emitting device, and a driving current flowing from the first driving sub-circuit to the first light emitting device is in an opposite direction to a driving current flowing from the second driving sub-circuit to the second light emitting device, wherein the first terminal of the first driving sub-circuit is different from the second terminal of the first driving sub-circuit, and the first terminal of the second driving sub-circuit is different from the second terminal of the second driving sub-circuit; and
    the charging sub-circuit is configured to charge the capacitor, and when the capacitor is discharged, the first driving sub-circuit drives the first light emitting device to emit light or the second driving sub-circuit drives the second light emitting device to emit light.

2. The pixel circuit of claim 1, wherein the first driving sub-circuit comprises a n-type driving transistor, and the second driving sub-circuit comprises a p-type driving transistor;
    a gate of the n-type driving transistor is connected to the first terminal of the capacitor, a source of the n-type driving transistor is connected to a first reference voltage source capable of supplying an alternate current signal, a drain of the n-type driving transistor is connected to a cathode of the first light emitting device, and an anode of the first light emitting device is connected to a second reference voltage source capable of supplying an alternate current signal;
    a gate of the p-type driving transistor is connected to the first terminal of the capacitor, a source of the p-type driving transistor is connected to the first reference voltage source, a drain of the p-type driving transistor is connected to an anode of the second light emitting device, and a cathode of the second light emitting device is connected to the second reference voltage source; and
    the second terminal of the capacitor is connected to the charging sub-circuit and the first reference voltage source.

3. The pixel circuit of claim 2, wherein the charging sub-circuit comprises a first gate signal source, a data signal source and a first switching transistor;
    a drain of the first switching transistor is connected to the data signal source, a source of the first switching transistor is connected to the second terminal of the capacitor, and a gate of the first switching transistor is connected to the first gate signal source;
    the first gate signal source is configured to control the first switching transistor to be turned on to connect the data signal source with the branch where the capacitor is located, such that the capacitor is charged by the data signal source.

4. The pixel circuit of claim 3, further comprising a first compensation sub-circuit connected to the first driving sub-circuit, and a second compensation sub-circuit connected to the second driving sub-circuit; wherein
    the first compensation sub-circuit comprises a second switching transistor;
    the second compensation sub-circuit comprises a third switching transistor;
    a source of the second switching transistor is connected to the gate of the n-type driving transistor, a drain of the second switching transistor is connected to the drain of the n-type driving transistor, and a gate of the second switching transistor is connected to a second gate signal source; and
    a source of the third switching transistor is connected to the gate of the p-type driving transistor, a drain of the third switching transistor is connected to the drain of the p-type driving transistor, and a gate of the third switching transistor is connected to the second gate signal source.

5. The pixel circuit of claim 4, further comprising a fourth switching transistor configured to control a connection from the first light emitting device and the second light emitting device to the second reference voltage source, wherein a gate of the fourth switching transistor is connected to a charging control signal source, a source of the fourth switching transistor is connected to the anode of the first light emitting device and the cathode of the second light emitting device, a drain of the fourth switching transistor is connected to the second reference voltage source, and the charging control signal source is configured to control the fourth switching transistor to be turned on or off.

6. The pixel circuit of claim 5, further comprising a fifth switching transistor configured to control a connection between the capacitor and the first reference voltage source; wherein
a gate of the fifth switching transistor is connected to a third gate signal source, a source of the fifth switching transistor is connected to the first reference voltage source, and a drain of the fifth switching transistor is connected to the second terminal of the capacitor; and
the third gate signal source is configured to control the fifth switching transistor to be turned on or off.

7. The pixel circuit of claim 6, wherein the first switching transistor, the second switching transistor and the third switching transistor are n-type transistors, and the fifth switching transistor is a p-type transistor; or
the first switching transistor, the second switching transistor and the third switching transistor are p-type transistors, and the fifth switching transistor is a n-type transistor; and
the first gate signal source, the second gate signal source and the third gate signal source are a same gate signal source.

8. A display panel comprising a plurality of pixel units arranged in matrix surrounded by gate lines and data lines, each of the pixel units comprising one pixel circuit according to claim 1 and a first light emitting device and a second light emitting device connected to the pixel circuit,
the charging sub-circuits in the pixel circuits located in a same row are connected to one and the same gate line, the charging sub-circuits in the pixel circuits located in a same column are connected to one and the same data line; during a period in which one frame of picture is displayed, before the first driving sub-circuits and the second driving sub-circuits drive the first light emitting devices to emit light and the second light emitting devices to emit light respectively in sequence, the charging sub-circuits charge the capacitors through the data line and the gate line.

9. The display panel of claim 8, comprising a pixel circuit wherein the charging sub-circuit comprises a first gate signal source, a data signal source and a first switching transistor;
a drain of the first switching transistor is connected to the data signal source, a source of the first switching transistor is connected to the second terminal of the capacitor, and a gate of the first switching transistor is connected to the first gate signal source;
the first gate signal source is configured to control the first switching transistor to be turned on to connect the data signal source with the branch where the capacitor is located, such that the capacitor is charged by the data signal source, the drain of the first switching transistor is connected to the data signal source through the data line, the gate of the first switching transistor is connected to the first gate signal source through the gate line; and
the gate signal source and the data signal source charge the capacitor through the gate line and the data line respectively.

10. A method for driving the pixel circuit according to claim 1, comprising:
during a period in which one frame of picture is displayed, the first driving sub-circuit and the second driving sub-circuit driving the first light emitting device to emit light and the second light emitting device to emit light respectively in sequence under the control of timing sequence; and
before the first driving sub-circuit drives the first light emitting device to emit light, the charging sub-circuit charging the capacitor, and when the capacitor is discharged, the first driving sub-circuit driving the first light emitting device to emit light or the second driving sub-circuit driving the second light emitting device to emit light.

11. The method of claim 10, wherein when the first reference voltage source is controlled to output a high level and the second reference voltage source is controlled to output a low level, the branch where the first driving sub-circuit is located is disconnected, the branch where the second driving sub-circuit is located is connected, and the second driving sub-circuit drives the second light emitting device to emit light; and
when the first reference voltage source is controlled to output the low level and the second reference voltage source is controlled to output the high level, the branch where the second driving sub-circuit is located is disconnected, the branch where the first driving sub-circuit is located is connected, and the first driving sub-circuit drives the first light emitting device to emit light.

12. The display panel of claim 9, wherein the pixel unit further comprises a first compensation sub-circuit connected to the first driving sub-circuit, and a second compensation sub-circuit connected to the second driving sub-circuit; wherein
the first compensation sub-circuit comprises a second switching transistor;
the second compensation sub-circuit comprises a third switching transistor;
a source of the second switching transistor is connected to the gate of the n-type driving transistor, a drain of the second switching transistor is connected to the drain of the n-type driving transistor, and a gate of the second switching transistor is connected to a second gate signal source; and
a source of the third switching transistor is connected to the gate of the p-type driving transistor, a drain of the third switching transistor is connected to the drain of the p-type driving transistor, and a gate of the third switching transistor is connected to the second gate signal source.

13. The display panel of claim 12, wherein the pixel unit further comprises a fourth switching transistor configured to control a connection from the first light emitting device and the second light emitting device to the second reference voltage source, wherein a gate of the fourth switching transistor is connected to a charging control signal source, a source of the fourth switching transistor is connected to the anode of the first light emitting device and the cathode of the second light emitting device, a drain of the fourth switching transistor is connected to the second reference voltage source, and the charging control signal source is configured to control the fourth switching transistor to be turned on or off.

14. The display panel of claim 13, wherein the pixel unit further comprises a fifth switching transistor configured to control a connection between the capacitor and the first reference voltage source; wherein
    a gate of the fifth switching transistor is connected to a third gate signal source, a source of the fifth switching transistor is connected to the first reference voltage source, and a drain of the fifth switching transistor is connected to the second terminal of the capacitor; and
    the third gate signal source is configured to control the fifth switching transistor to be turned on or off.

15. The display panel of claim 14, wherein the first switching transistor, the second switching transistor and the third switching transistor are n-type transistors, and the fifth switching transistor is a p-type transistor; or
    the first switching transistor, the second switching transistor and the third switching transistor are p-type transistors, and the fifth switching transistor is a n-type transistor; and
    the first gate signal source, the second gate signal source and the third gate signal source are a same gate signal source.

16. The method of claim 11, wherein the first driving sub-circuit comprises a n-type driving transistor, and the second driving sub-circuit comprises a p-type driving transistor;
    a gate of the n-type driving transistor is connected to the first terminal of the capacitor, a source of the n-type driving transistor is connected to a first reference voltage source capable of supplying an alternate current signal, a drain of the n-type driving transistor is connected to a cathode of the first light emitting device, and an anode of the first light emitting device is connected to a second reference voltage source capable of supplying an alternate current signal;
    a gate of the p-type driving transistor is connected to the first terminal of the capacitor, a source of the p-type driving transistor is connected to the first reference voltage source, a drain of the p-type driving transistor is connected to an anode of the second light emitting device, and a cathode of the second light emitting device is connected to the second reference voltage source; and
    the second terminal of the capacitor is connected to the charging sub-circuit and the first reference voltage source.

17. The method of claim 16, wherein the charging sub-circuit comprises a first gate signal source, a data signal source and a first switching transistor;
    a drain of the first switching transistor is connected to the data signal source, a source of the first switching transistor is connected to the second terminal of the capacitor, and a gate of the first switching transistor is connected to the first gate signal source;
    the first gate signal source is configured to control the first switching transistor to be turned on to connect the data signal source with the branch where the capacitor is located, such that the capacitor is charged by the data signal source.

18. The method of claim 17, wherein the pixel circuit further comprises a first compensation sub-circuit connected to the first driving sub-circuit, and a second compensation sub-circuit connected to the second driving sub-circuit; wherein
    the first compensation sub-circuit comprises a second switching transistor;
    the second compensation sub-circuit comprises a third switching transistor;
    a source of the second switching transistor is connected to the gate of the n-type driving transistor, a drain of the second switching transistor is connected to the drain of the n-type driving transistor, and a gate of the second switching transistor is connected to a second gate signal source; and
    a source of the third switching transistor is connected to the gate of the p-type driving transistor, a drain of the third switching transistor is connected to the drain of the p-type driving transistor, and a gate of the third switching transistor is connected to the second gate signal source.

19. The method of claim 18, wherein the pixel circuit further comprises a fourth switching transistor configured to control a connection from the first light emitting device and the second light emitting device to the second reference voltage source, wherein a gate of the fourth switching transistor is connected to a charging control signal source, a source of the fourth switching transistor is connected to the anode of the first light emitting device and the cathode of the second light emitting device, a drain of the fourth switching transistor is connected to the second reference voltage source, and the charging control signal source is configured to control the fourth switching transistor to be turned on or off.

20. The method of claim 19, wherein the pixel circuit further comprises a fifth switching transistor configured to control a connection between the capacitor and the first reference voltage source; wherein
    a gate of the fifth switching transistor is connected to a third gate signal source, a source of the fifth switching transistor is connected to the first reference voltage source, and a drain of the fifth switching transistor is connected to the second terminal of the capacitor; and
    the third gate signal source is configured to control the fifth switching transistor to be turned on or off.

\* \* \* \* \*